US009197224B2

(12) United States Patent
Kinget et al.

(10) Patent No.: US 9,197,224 B2
(45) Date of Patent: Nov. 24, 2015

(54) CIRCUITS AND METHODS FOR A COMBINED PHASE DETECTOR

(75) Inventors: Peter R. Kinget, Summit, NJ (US); Chunwei Hsu, New York, NY (US); Shih-An Yu, Taipei (TW); Karthik Tripurari, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 13/549,262

(22) Filed: Jul. 13, 2012

(65) Prior Publication Data

US 2013/0156076 A1 Jun. 20, 2013

Related U.S. Application Data

(60) Provisional application No. 61/507,456, filed on Jul. 13, 2011.

(51) Int. Cl.
| | |
|---|---|
| *H03L 7/06* | (2006.01) |
| *H03L 7/08* | (2006.01) |
| *H03L 7/087* | (2006.01) |
| *H03L 7/091* | (2006.01) |
| *H03L 7/089* | (2006.01) |
| *H03L 7/23* | (2006.01) |
| *H03L 7/10* | (2006.01) |
| *H04L 27/18* | (2006.01) |

(52) U.S. Cl.
CPC ............... *H03L 7/091* (2013.01); *H03L 7/087* (2013.01); *H03L 7/0891* (2013.01); *H03L 7/235* (2013.01); *H03L 7/0893* (2013.01); *H04L 27/18* (2013.01)

(58) Field of Classification Search
CPC ......... H03L 7/087; H03L 7/091; H03L 7/235; H03L 7/10; H03L 7/0891; H03L 7/0893
USPC ................. 375/371, 354, 373, 374, 375, 376; 327/157, 156, 155, 141, 100
See application file for complete search history.

(56) References Cited

U.S. PATENT DOCUMENTS

| | | | |
|---|---|---|---|
| 6,463,112 B1 | 10/2002 | Hafez et al. | |
| 7,737,743 B1 | 6/2010 | Gao et al. | |
| 2009/0184740 A1* | 7/2009 | Salleh | ........................... 327/157 |
| 2009/0285279 A1* | 11/2009 | Nathawad | ..................... 375/238 |

OTHER PUBLICATIONS

Xiang Gao; Klumperink, E.A.M.; Socci, G.; Bohsali, M.; Nauta, B., "Spur Reduction Techniques for Phase-Locked Loops Exploiting a Sub-Sampling Phase Detector," Solid-State Circuits, IEEE Journal of, vol. 45, No. 9, pp. 1809,1821, Sep. 2010.*

(Continued)

*Primary Examiner* — Chien M Fan
*Assistant Examiner* — Michelle M Koeth
(74) *Attorney, Agent, or Firm* — Byrne Poh LLP

(57) ABSTRACT

Circuits and methods for a combined phase detector are provided. In some embodiments, circuits for a combined phase detector are provided, the circuits comprising: a tri-state phase frequency detector and charge pump that receives a reference signal and a first input signal, and that produces a first output signal; and a sub-sampling phase detector that receives the reference signal and a second input signal, and that outputs a second output signal, wherein the first output signal and the second output signal are coupled together.

10 Claims, 12 Drawing Sheets

(56) References Cited

OTHER PUBLICATIONS

Fujitsu, "Loop filter calculation," http://www.fujitsu.com/emea/services/microelectronics/pll/applications_loopfilter.html, last accessed Nov. 1, 2013.*

Crystek, "C.C. CPRO", last accessed Jul. 7, 2015, pp. 1, available at: http://www.crystek.com/.

Gao, X., et al., "A Low Noise Sub-Sampling PLL in Which Divider Noise is Eliminated and PD/CP Noise is Not Multiplied by N2", In IEEE Journal of Solid-State Circuits, vol. 44, No. 12, Dec. 2009, pp. 3253-3263.

Gao, X., et al., "Jitter Analysis and a Benchmarking Figure-of-Merit for Phase-Locked Loops", In IEEE Transactions on Circuits and Systems II: Express Briefs, vol. 56, No. 2, Feb. 2009, pp. 117-121.

Gao, X., et al., "Spur-Reduction Techniques for PLLs using Sub-Sampling Phase Detection", In Proceedings of the IEEE International Solid-State Circuits Conference (ISSCC '10), San Francisco, CA, USA, Feb. 7-11, 2010, pp. 474-475.

Gao, X., et al., "Spur Reduction Techniques for Phase-Locked Loops Exploiting a Sub-Sampling Phase Detector", In IEEE Journal of Solid-State Circuits, vol. 45, No. 9, Sep. 2010, pp. 1809-1821.

Gierkink, S., "Low-Spur, Low-Phase-Noise Clock Multiplier based on a Combination of PLL and Recirculating DLL with Dual-Pulse Ring Oscillator and Self-Correcting Charge Pump", In IEEE Journal of Solid-State Circuits, vol. 43, No. 12, Dec. 2008, pp. 2967-2976.

Gu, R., et al., "A 6.25GHz 1V LC-PLL in 0.13 µm CMOS", In Proceedings of the IEEE International Solid-State Circuits Conference (ISSCC '06), San Francisco, CA, USA, Feb. 6-9, 2006, pp. 2442-2451.

Hedayati, H., et al., "A 1 MHz Bandwidth, 6 GHz 0.18 µm CMOS Type-I ΔΣ Fractional-N Synthesizer for WiMAX Applications", In IEEE Journal of Solid-State Circuits, vol. 44, No. 12, Dec. 2009, pp. 3244-3252.

Hsu, C.M., et al., "A Low-Noise, Wide-BW 3.6GHz Digital ΔΣ Fractional-N Frequency Synthesizer with a Noise-Shaping Time-to-Digital Converter and Quantization Noise Cancellation", In Proceedings of the IEEE Int. Solid-State Circuits Conference (ISSCC '08), San Francisco, CA, US, Feb. 3-7, 2008, pp. 1-11.

Hsu, C.W., et al., "A 2.2 GHz PLL using a Phase-Frequency Detector with an Auxiliary Sub-Sampling Phase Detector for In-Band Noise Suppression", In Proceedings of the IEEE Custom Integrated Circuits Conference, Sep. 2011, pp. 1-4.

Huang, P.C., et al., "A 2.3 GHz Fractional-N Dividerless Phase-Locked Loop with-112 dBc/Hz In-Band Phase Noise", In Proceedings of the IEEE International Solid-State Circuits Conference, Feb. 2014, pp. 362-363.

Levantino, S., et al., "A Wideband Fractional-N PLL with Suppressed Charge-Pump Noise and Automatic Loop Filter Calibration", In IEEE Journal of Solid-State Circuits, vol. 48, No. 10, Oct. 2013, pp. 2419-2429.

Levantino, S., et al., "Phase Noise in Digital Frequency Dividers", In IEEE Journal of Solid-State Circuits, vol. 39, No. 5, May 2004, pp. 775-784.

Park, D. and Cho, S., "A 14.2 mW 2.55-to-3 GHz cascaded PLL with Reference Injection and 800 MHz Delta-Sigma Modulator in 0.13 µm CMOS", In IEEE Journal of Solid-State Circuits, vol. 47, No. 12, Dec. 2012, pp. 2989-2998.

Sai, A., et al., "A Digitally Stabilized Type-III PLL using Ring VCO with 1.01 ps rms Integrated Jitter in 65 nm CMOS", In Proceedings of the IEEE International Solid-State Circuits Conference, Feb. 2012, pp. 248-250.

Sogo, K., et al., "A Ring-VCO-Based Sub-Sampling PLL CMOS Circuit with-119 dBc/Hz Phase Noise and 0.73 ps Jitter", In Proceedings of the European Solid-State Circuits Conference, Sep. 2012, pp. 253-256.

Vaucher, C., et al., "A Family of Low-Power Truly Modular Programmable Dividers in Standard 0.35 µm CMOS Technology", In IEEE Journal of Solid-State Circuits, vol. 35, No. 7, Jul. 2000, pp. 1039-1045.

Wang, K.J., et al., "Spurious Tone Suppression Techniques Applied to a Wide-Bandwidth 2.4 GHz Fractional-N PLL", In IEEE Journal of Solid-State Circuits, vol. 43, No. 12, Dec. 2008, pp. 2787-2797.

Yu, S.A. and Kinget, P., "A 0.65-V 2.5-GHz Fractional-N Synthesizer with Two-Point 2-Mb/s GFSK Data Modulation", In IEEE Journal of Solid-State Circuits, vol. 44, No. 9, Sep. 2009, pp. 2411-2425.

Yu, S.A., "Design Techniques for Frequency Synthesizers in Highly Scaled CMOS Technologies," Ph.D. Thesis, Columbia University, (month unknown) 2012, pp. 1-299, available at: http://academiccommons.columbia.edu/catalog/ac:146735.

* cited by examiner

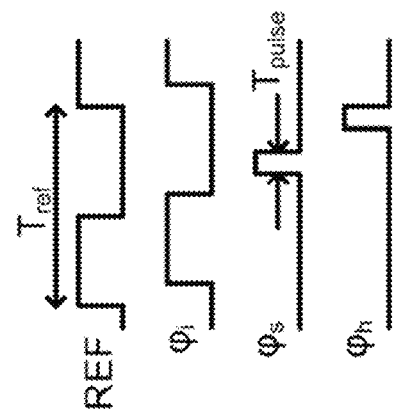
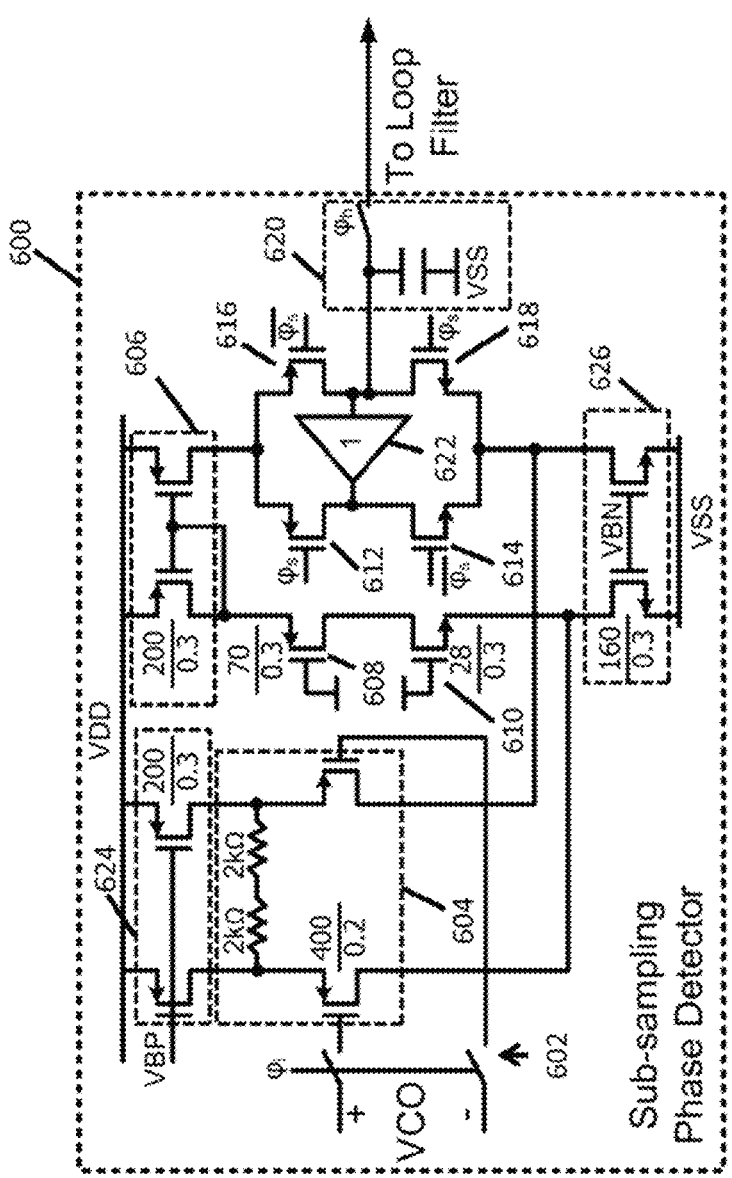
FIG. 6(b)
FIG. 6(a)

CIRCUITS AND METHODS FOR A COMBINED PHASE DETECTOR

CROSS REFERENCE TO RELATED APPLICATION

This application claims the benefit of U.S. Provisional Patent Application No. 61/507,456, filed Jul. 13, 3011, which is hereby incorporated by reference herein in its entirety.

STATEMENT REGARDING GOVERNMENT FUNDED RESEARCH

This invention was made with government support under Contract No. 1002064 awarded by the National Science Foundation. The government has certain rights in the invention.

BACKGROUND

The in-band phase noise of a phase-locked loop circuit (PLL) can be heavily dominated by noise from a phase detector of the PLL circuit. Tri-state phase-frequency detectors (PFDs) are commonly used in PLL circuits as a phase detector for their ability to act as frequency detectors in addition to their ability to detect phase. However, tri-state PFDs can suffer from relatively large in-band phase noise.

Sub-sampling phase detectors (SSPDs) have also been used in PLL circuits as a phase detector. However, PLL circuits with SSPDs typically have a narrow locking range and disturbances can push the PLL circuits out of a locked state.

Accordingly, new circuits and methods for providing phase detectors are desirable.

SUMMARY

Circuits and methods for a combined phase detector are provided. In some embodiments, circuits for a combined phase detector are provided, the circuits comprising: a tri-state phase frequency detector and charge pump that receives a reference signal and a first input signal, and that produces a first output signal; and a sub-sampling phase detector that receives the reference signal and a second input signal, and that outputs a second output signal, wherein the first output signal and the second output signal are coupled together.

In some embodiments, circuits for a combined phase detector are provided, the circuits comprising: means for providing a tri-state phase frequency detector and charge pump that receives a reference signal and a first input signal, and that produces a first output signal; and means for providing a sub-sampling phase detector that receives the reference signal and a second input signal, and that outputs a second output signal, wherein the first output signal and the second output signal are coupled together.

In some embodiments, methods for providing a combined phase detector are provided, the methods comprising: providing a tri-state phase frequency detector and charge pump that receives a reference signal and a first input signal, and that produces a first output signal; and providing a sub-sampling phase detector that receives the reference signal and a second input signal, and that outputs a second output signal, wherein the first output signal and the second output signal are coupled together.

BRIEF DESCRIPTION OF THE DRAWINGS

FIG. 6(a) is a schematic of an example of a sub-sampling phase detector in accordance with some embodiments.

FIG. 6(b) is a schematic of an example of a reference signal and control signals for a sub-sampling phase detector in accordance with some embodiments.

DETAILED DESCRIPTION

In accordance with some embodiments, circuits and methods for a combined phase detector (PD) are provided. In some embodiments, a tri-state phase frequency detector, charge pump (PFD/CP) can be combined with a sub-sampling phase detector (SSPD) to provide a combined PD. This combined PD can be used for any suitable purpose, such as in phase-locked loop (PLL) circuits, for example. Such a combined PD can maintain phase-frequency detection capabilities while simultaneously obtaining in-band phase noise suppression in some embodiments. In some embodiments, such a PLL circuit can be implemented as a 2.2 GHz integer-N PLL in a 65 nm CMOS process.

Figure 1:
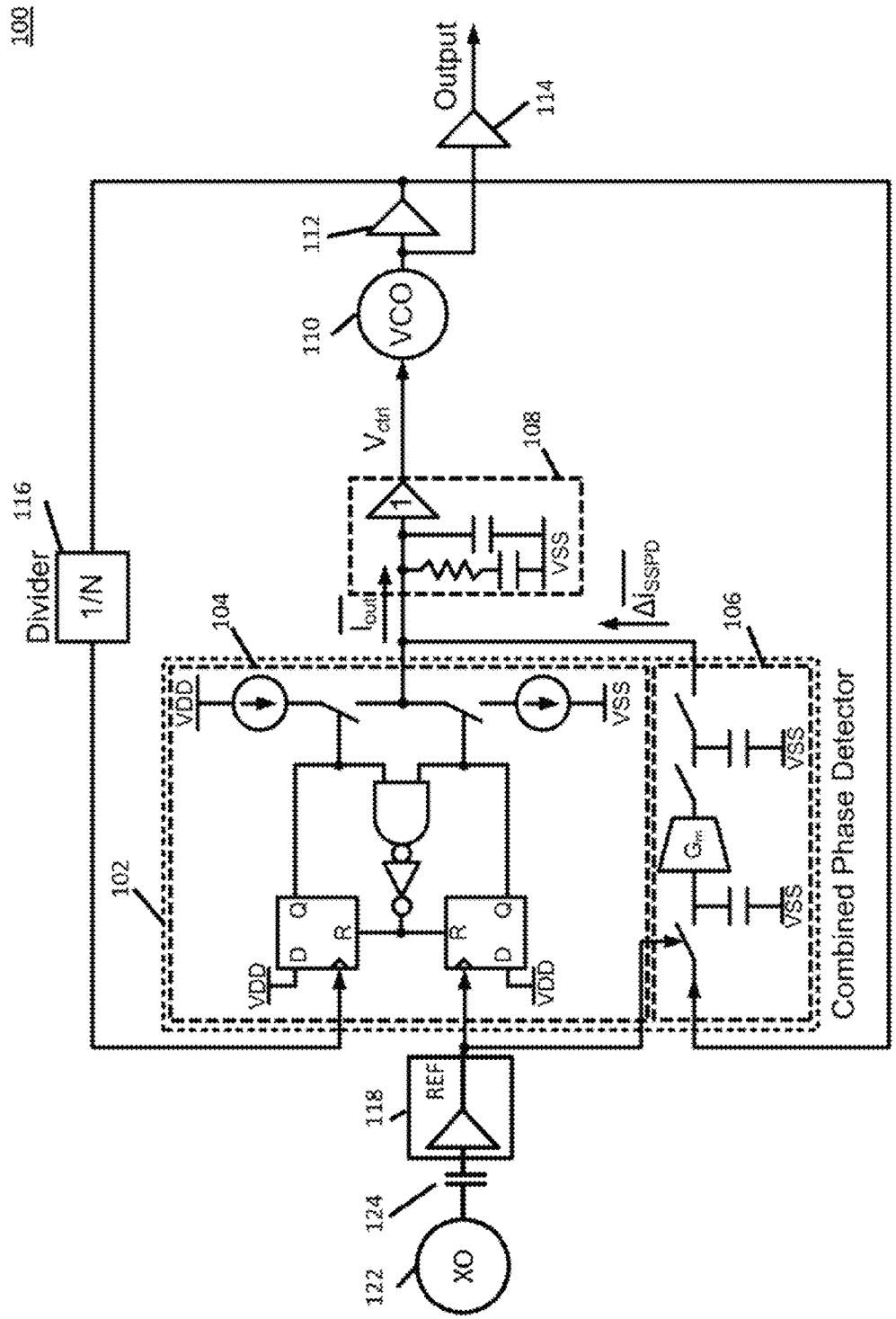
FIG. 1 is a schematic of a phase-locked loop circuit in accordance with some embodiments.

An example of a PLL circuit 100 in accordance with some embodiments is illustrated in FIG. 1. As shown, PLL circuit 100 can include a combined phase detector 102 that includes a tri-state PFD/CP 104 and an SSPD 106, a loop filter 108, a voltage controlled oscillator (VCO) 110, a feedback buffer 112, an output buffer 114, a divider 116, a reference buffer circuit 118, a crystal oscillator 122 (e.g., a 50 MHz crystal reference source), a capacitor 124, and/or any other suitable circuits and/or components.

Figure 2:
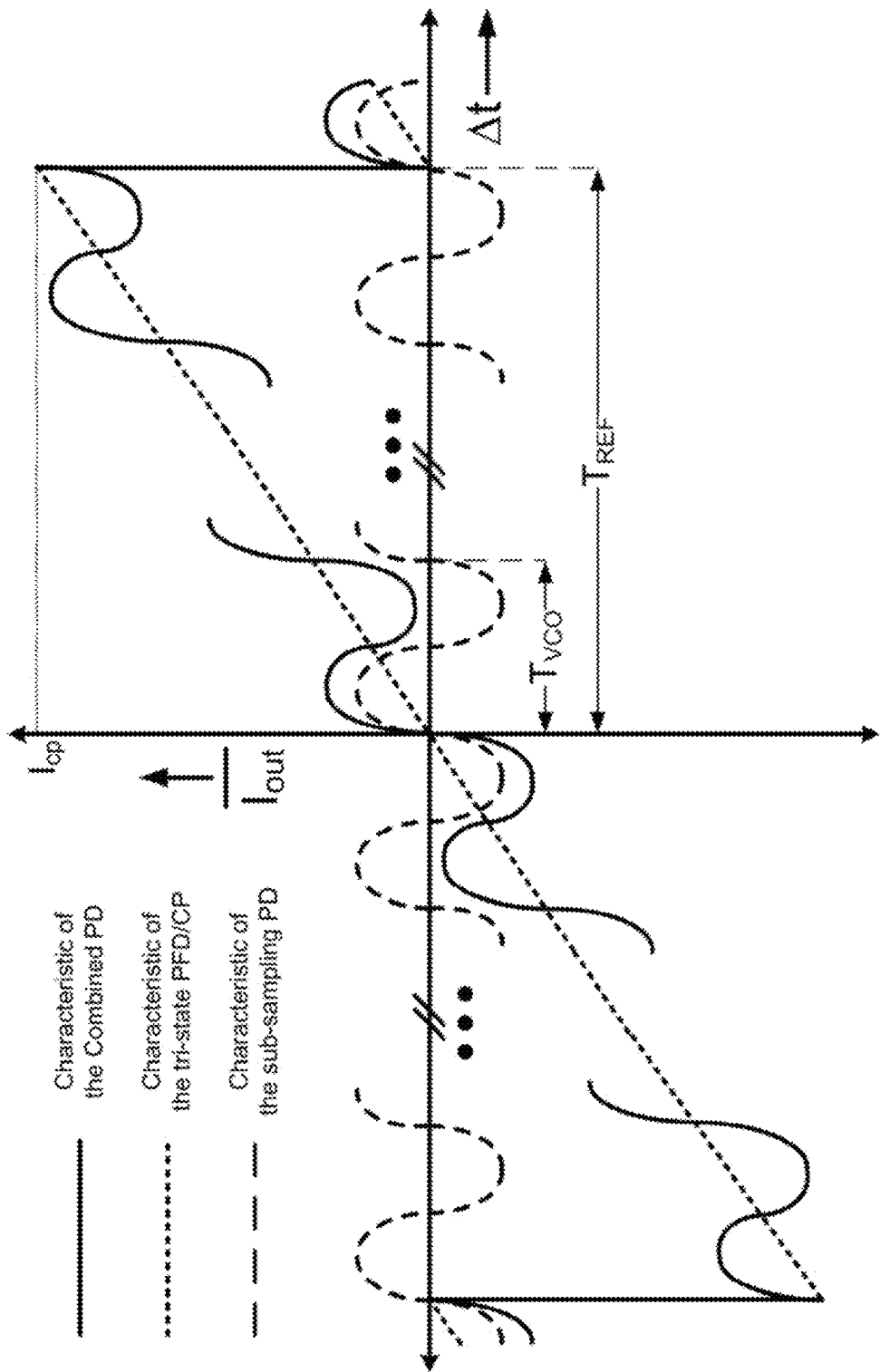
FIG. 2 is a graph of an example of the transfer characteristic of a combined phase detector in accordance with some embodiments.

An example of transfer characteristic of combined phase detector 102 of FIG. 1 is shown in FIG. 2. As illustrated, the characteristic of combined phase detector 102 (represented as a solid line) is formed by summing the characteristic of the tri-state PFD/CP 104 (represented as a short dashed line) and the characteristic of the SSPD 106 (represented as a lone dashed line). The y-axis $\overline{I_{out}}$ shows the averaged output current of the combined phase detector for a given time difference $\Delta t$ between the edges of the phase detector inputs.

To retain the frequency detecting ability of a tri-state PFD/CP, the zero output current of the combined phase detector can be configured to occur at Δt=0 in some embodiments. The combined phase detector can produce positive currents for all positive Δt and negative currents for all negative Δt, in some embodiments.

In some embodiments, the maximum output current, $\overline{\Delta t_{SSPD}}$, of SSPD 106 is limited by the output current of PFD/CP 104 for $\Delta t = \pm 3/4 \cdot T_{VCO}$, which is $\pm 3I_{CP}/(4N)$ where $I_{CP}$ is the charge pump current of the tri-state PFD and N is the integer frequency division ratio $\omega_{VCO}/\omega_{REF}$. When keeping the sampling phase detector output current $\overline{\Delta t_{SSPD}}$ smaller than $3I_{CP}/(4N)$, combined phase detector 102 can operate as a frequency detector in the presence of frequency errors and PLL circuit 100 can have a wide acquisition range with a single stable locking point. When the PLL circuit is in lock, the SSPD can increase the total phase detector gain around the zero timing error point to:

$$K_{PD,comb,MAX} = \frac{\overline{I_{out}}}{\Delta \phi_{REF}} = \frac{I_{CP}}{2\pi} + \left(\frac{3I_{CP}}{4N}\right)\frac{T_{REF}}{T_{VCO}} \approx 5.7 \times \frac{I_{CP}}{2\pi} \quad (1)$$

Figure 3A:
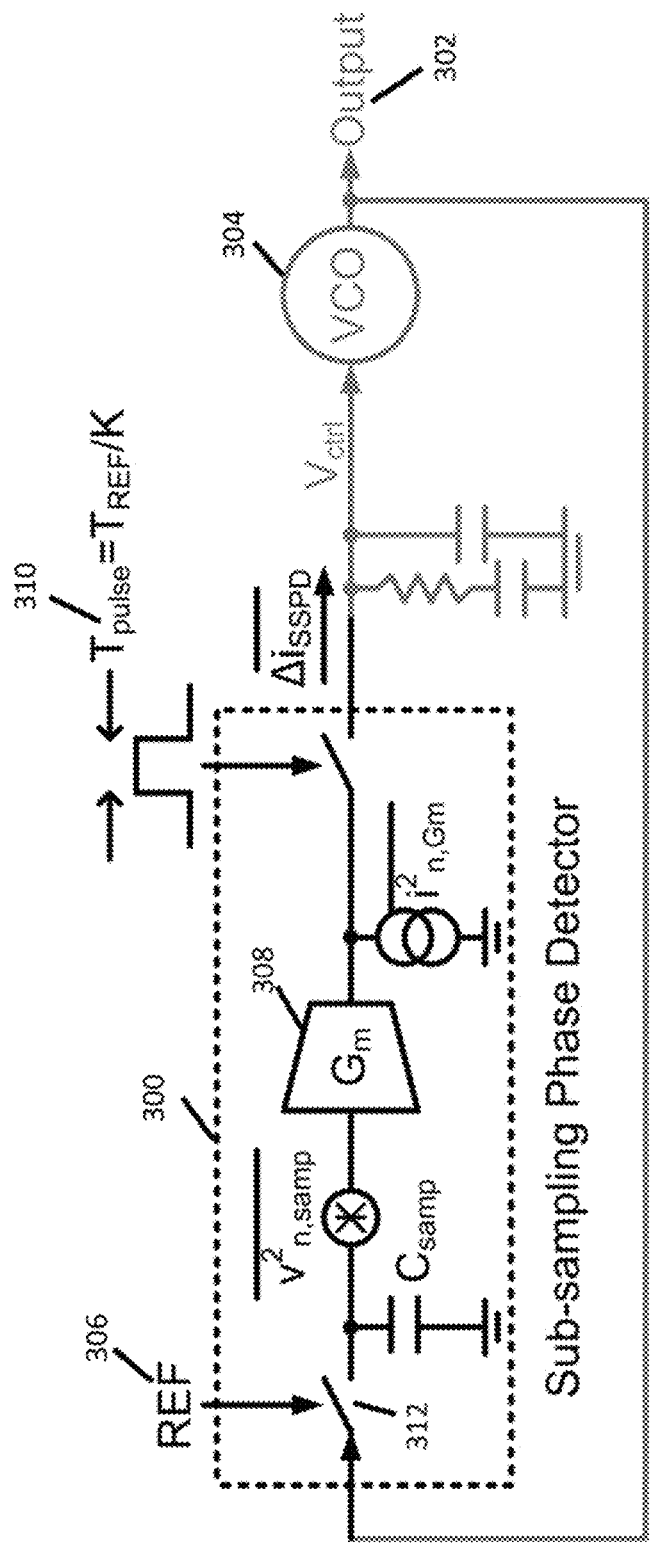
FIG. 3(a) is a schematic of an example of a sub-sampling phase detector in accordance with some embodiments.
Figure 3B:
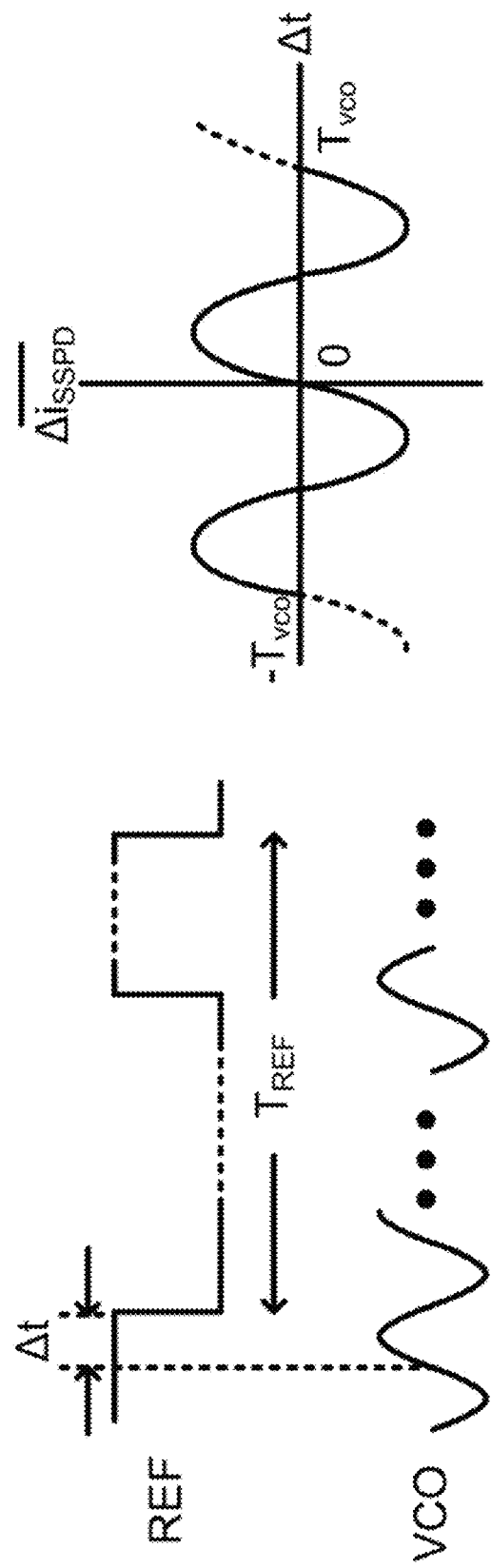
FIG. 3(b) is a graph of an example of input and output signals of a sub-sampling phase detector in accordance with some embodiments.

An example 300 of a block diagram of an SSPD that can be used as SSPD 106 of FIG. 1 in accordance with some embodiments is shown in FIG. 3(*a*). As illustrated, the output voltage 302 of a VCO 304 (with an amplitude of $A_{VCO}$ and an angular frequency of $\omega_{VCO}$) is sampled by a sampling switch 312 controlled by input reference signal REF 306, and then the sampled signal is converted into a current signal by a transconductor $G_m$ 308. That current signal is steered to the loop filter for a duration $T_{pulse} = T_{REF}/K$ 310.

Figure 4:
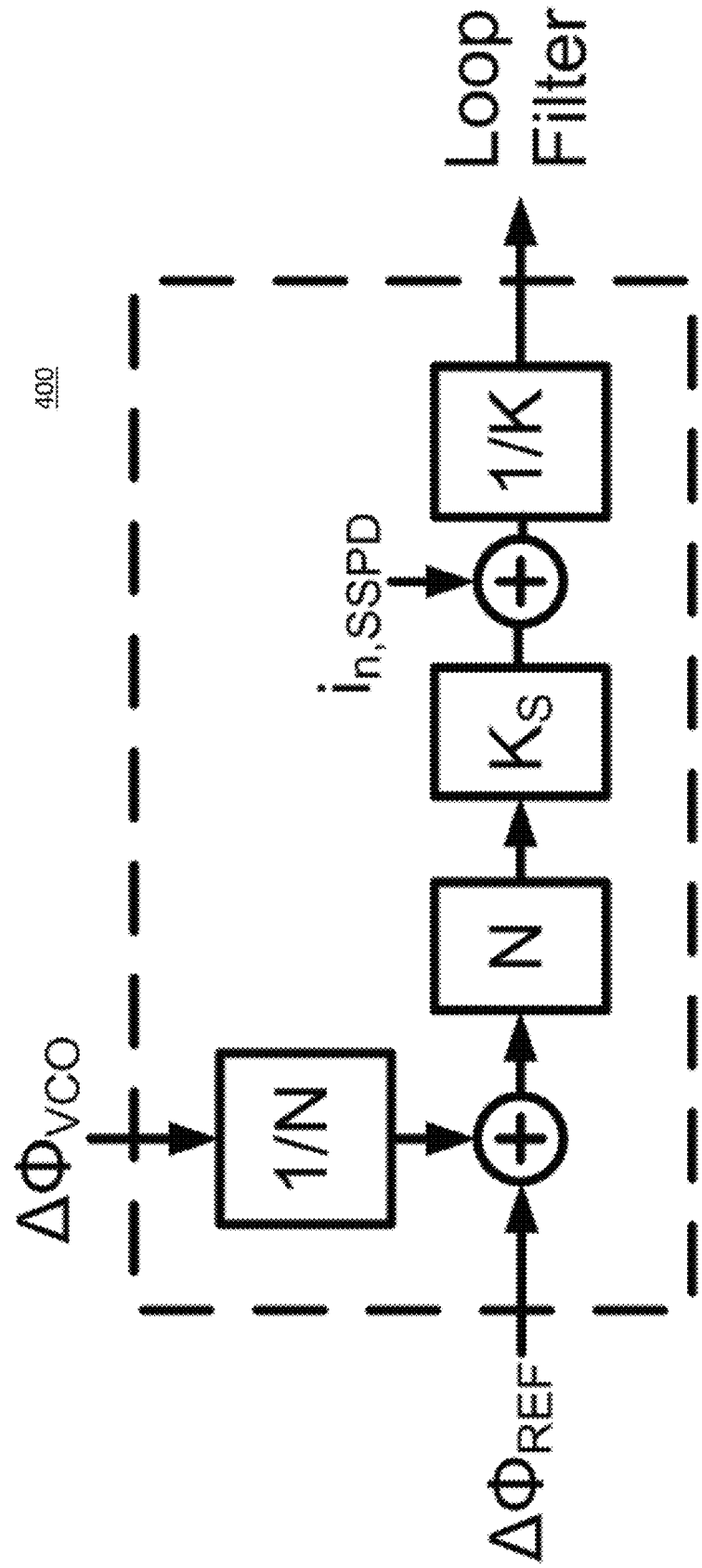
FIG. 4 is a schematic of an example of a phase domain model of a sub-sampling phase detector in accordance with some embodiments.

An example 400 of an equivalent phase domain model of the SSPD of FIG. 3(*a*) in accordance with some embodiments is given in FIG. 4. The analysis of the SSPD in a frequency locked state (i.e., when $\omega_{VCO} = N\omega_{REF}$) can be described as follows.

Assuming the VCO signal is a referred signal, a small phase change at the REF signal due to a small time change Δt (see FIG. 3(*b*)) can be represented by $\Delta \phi_{REF} = \omega_{REF} \Delta t$. Similarly, while REF is a referred signal, a small phase change at the VCO signal due to a small time change can be represented by $\Delta \phi_{VCO} = \omega_{VCO} \Delta t$. Therefore, the SSPD can be represented by:

$$K_{PD} = \frac{\overline{\Delta t_{SSPD}}}{\Delta \phi_{REF}} = N \times \frac{\overline{\Delta t_{SSPD}}}{\Delta \phi_{VCO}} N \times \left(\frac{S}{\omega_{VCO}} \times G_m\right) \times \frac{T_{pulse}}{T_{REF}} = N \times K_S \times \frac{1}{K} \quad (2)$$

where $\overline{\Delta t_{SSPD}}$ is the averaged output current of the phase detector, N is the integer frequency division ratio ($\omega_{VCO}/\omega_{REF}$), and S is the slope of the VCO signal around phase detector's operating point. For a sinusoidal VCO signal, S equals to $A_{VCO}\omega_{VCO}$.

The main contributors to the noise of the SSPD are sampling switch 312 (FIG. 3(*a*)) and transconductor 308 (FIG. 3(*a*)). The total current noise spectral density can be represented by:

$$S_{in,SSPD} = \frac{\overline{v_{n,samp}^2}}{f_{REF}/2} \times G_m^2 + S_{in,Gm} \times K \quad (3)$$

where $\overline{v_{n,samp}^2}$ is the standard deviation of the noise voltage at the output of sampling switch 312 (FIG. 3(*a*)) and $S_{in,Gm}$ is the current noise power spectral density of transconductor 308 (FIG. 3(*a*)).

Figure 5:
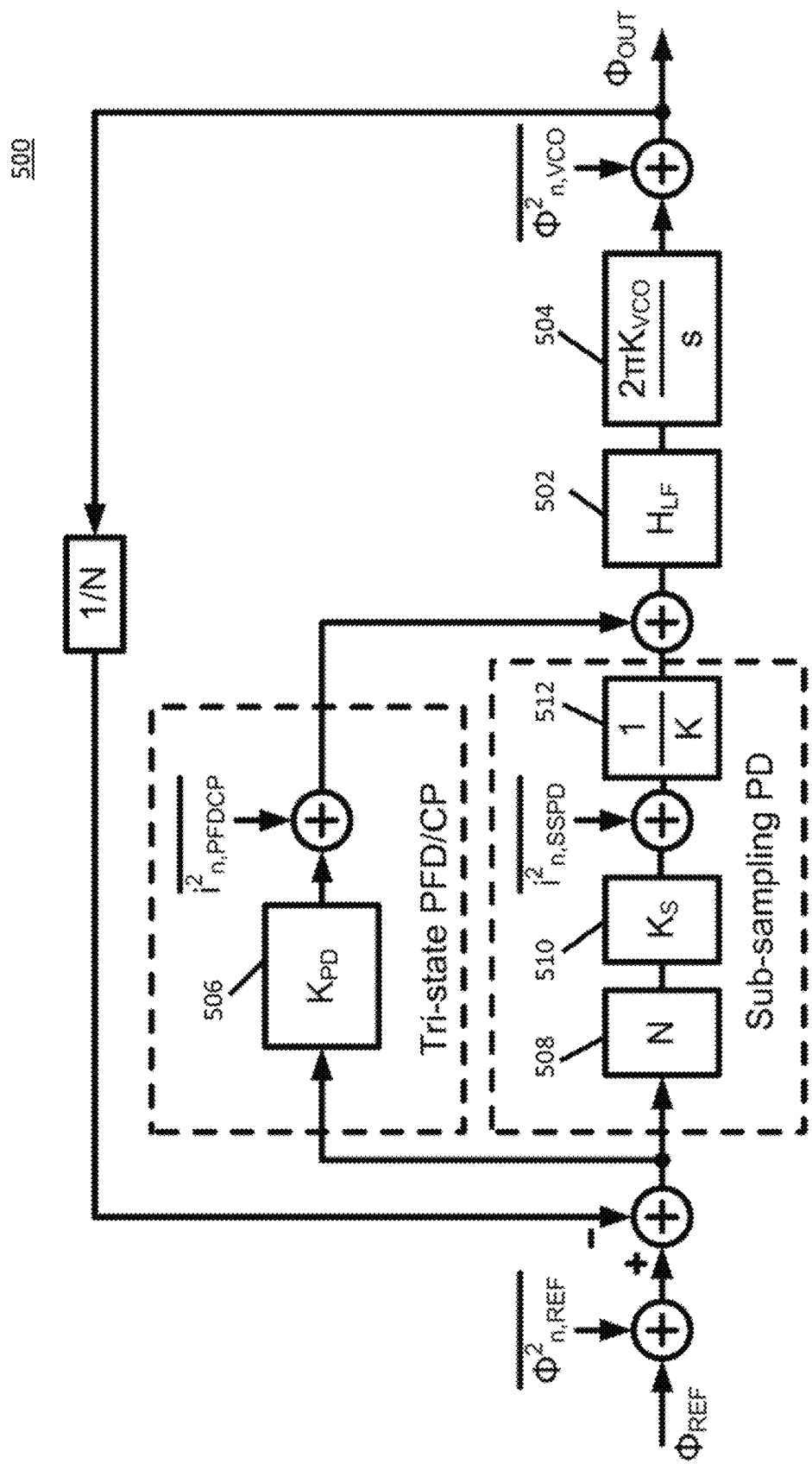
FIG. 5 is a schematic of an example of a phase domain model of a phase-locked loop circuit in accordance with some embodiments.

An example 500 of a phase domain model of PLL circuit 100 of FIG. 1 in a locked condition is shown in FIG. 5. $H_{LF}(s)$ 502 represents the transfer function of loop filter 108 of FIG. 1, $K_{VCO}$ in 504 is the frequency tuning gain of VCO 110 of FIG. 1, $K_{PD}$ in 506 is the gain of tri-state PFD/CP 104 of FIG. 1, and $(N \cdot K_S)/K$ in 508, 510, and 512 is the gain of SSPD 106 of FIG. 1. The gain of combined phase detector 102 is $K_{PD,comb} = K_{PD} + (N \cdot K_S)/K$.

The power spectral spectrum of the output phase noise of PLL circuit 100, $S_{\phi,n,out}$, can be expressed as:

$$S_{\phi,n,out} = \left(\frac{1}{1+L(s)}\right)^2 \cdot S_{\phi,n,VCO} + \left(\frac{L(s) \cdot N}{1+L(s)}\right)^2 \cdot \quad (4)$$
$$\frac{1}{K_{PD,comb}^2} \cdot \left(S_{i,n,PFDCP} + \frac{s_{i,n,SSPD}}{K^2}\right) + \left(\frac{L(s) \cdot N}{1+L(s)}\right)^2 \cdot S_{\phi,n,REF}$$

where $S_{\phi,n,VCO}$ and $S_{\phi,n,REF}$ are the noise power spectral density from the VCO and reference buffer circuit, respectively, and L(s) is equal to $K_{PD,comb} H_{LF}(2\pi K_{VCO}/s)/N$ and is the loop gain of the PLL circuit.

As shown in model 500, noise from SSPD 106 undergoes attenuation by a factor of K by 512 causing the SSPD's noise to become negligible compared to that of the tri-state PFD/CP.

To retain the frequency detecting ability of a tri-state PFD, the maximum output current of the SSPD in the combined PD can be smaller than $3I_{CP}/(4N)$ in some embodiments. Leaving some margin for error in the gain of the SSPD, the maximum output current of the SSPD can be chosen to be:

$$\overline{\Delta t_{SSPD,max}} = \frac{K_S}{K} = \frac{2I_{CP}}{\pi N} < \frac{3I_{CP}}{4N} \quad (5)$$

Thus, the total gain of the combined PD can be expressed as:

$$K_{PD,comb} = \frac{I_{CP}}{2\pi} + \frac{NK_S}{K} = \frac{5I_{CP}}{2\pi} \quad (6)$$

Moreover, since $K_S = A_{VCO} G_m$, the value of the transconductor can be calculated as:

$$G_m = \frac{4}{5} \times \frac{K_{PD,comb}}{A_{VCO}} \times \frac{K}{N} \quad (7)$$

Assuming $K_{PD,comb} = (1.25/2\pi)$(mA), $A_{VCO} = 1$ V differential and the gain reduction factor of K chosen by πN, the value of the transconductor, $G_m$, equals 0.5 (mA/V).

An example 600 of a sub-sampling phase detector (SSPD) that can be used in PLL circuit 100 in accordance with some embodiments is shown in FIG. 6(*a*). As illustrated, SSPD 600 includes VCO sampling switches 602, a transconductor 604, a current source 606, switching transistors 608 and 610, switching transistors 612, 614, 616, and 618, sample and hold filter 620, unity-gain buffer 622, and current sources 624 and 626.

The signal from the VCO output can be received at VCO sampling switches 602. VCO sampling switches 602 can be any suitable components. For example, in some embodiments, VCO sampling switches can be Metal Oxide Semiconductor Field Effect Transistors (MOSFETs). VCO sampling switches 602 can be controlled by a signal $\phi_i$ that is derived from the reference signal as illustrated, for example, in FIG. 6(b), by any suitable timing control circuit.

As shown in FIG. 6(a), transconductor 604 can be implemented in some embodiments using a pair of resistors and a pair of transistors. Any suitably sized resistors and transistors, and any suitable type of transistors (e.g., such as MOSFETs), can be used in some embodiments. For example, in some embodiments, the resistors can be 2 kΩ resistors and the transistors can be MOSFETs with a width of 400 μm and a length of 0.2 μm.

Current source 606 can be implemented using any suitable transistors. For example, in some embodiments, current source 606 can be implemented using MOSFETs with a width of 200 μm and a length of 0.3 μm.

Switching transistors 608 and 610 can be implemented using any suitable transistors, such as MOSFETs with their gates connected to $V_{SS}$ and $V_{DD}$, respectively. As illustrated, in some embodiments, transistor 608 can have a width of 70 μm and a length of 0.3 μm, and transistor 610 can have a width of 28 μm and a length of 0.3 μm.

Switching transistors 612, 614, 616, and 618 can be any suitable switching transistors. For example, switching transistors can be implemented with MOSFETs in some embodiments. As shown in FIG. 6(a), these transistors can be controlled by a signal $\phi_s$ that is derived from the reference signal as illustrated, for example, in FIG. 6(b), by any suitable timing control circuit.

Sample and hold filter 620 can be any suitable sample and hold filter. For example, as shown, filter 620 can be implemented with a capacitor and a switch. Any suitable capacitor and any suitable switch can be used in some embodiments. For example, the switch can be implemented using a MOSFET in some embodiments. As also shown, the switch can be controlled by a signal $\phi_h$ that is derived from the reference signal as illustrated, for example, in FIG. 6(b), by any suitable timing control circuit, in some embodiments. The sample-and-hold filter can be used to reduce reference ripple caused by the sub-sampling phase detector due to it generating a SINC function with a notch at the reference frequency in some embodiments.

Unity-gain buffer 622 can be any suitable unity-gain buffer. As shown, unity-gain buffer 622 can be provided in the SSPD to maintain the same voltages at the drain nodes of current sources 606 and 626 and at the capacitor of sample and hold filter 620. This buffer can reduce the output current ripple due to charge sharing between these nodes during switching.

Current sources 624 and 626 can be any suitable current sources. For example, current sources 624 and 626 can be implemented using any suitable transistors, such as MOSFETs, where the transistors of sources 624 have a width of 200 μm and a length of 0.3 μm, and the transistors of sources 626 have a width of 160 μm a length of 0.3 μm. As shown, the current provided by current sources 624 and 626 can be controlled by suitable positive and negative bias voltages VBP and VBN.

Figure 7:
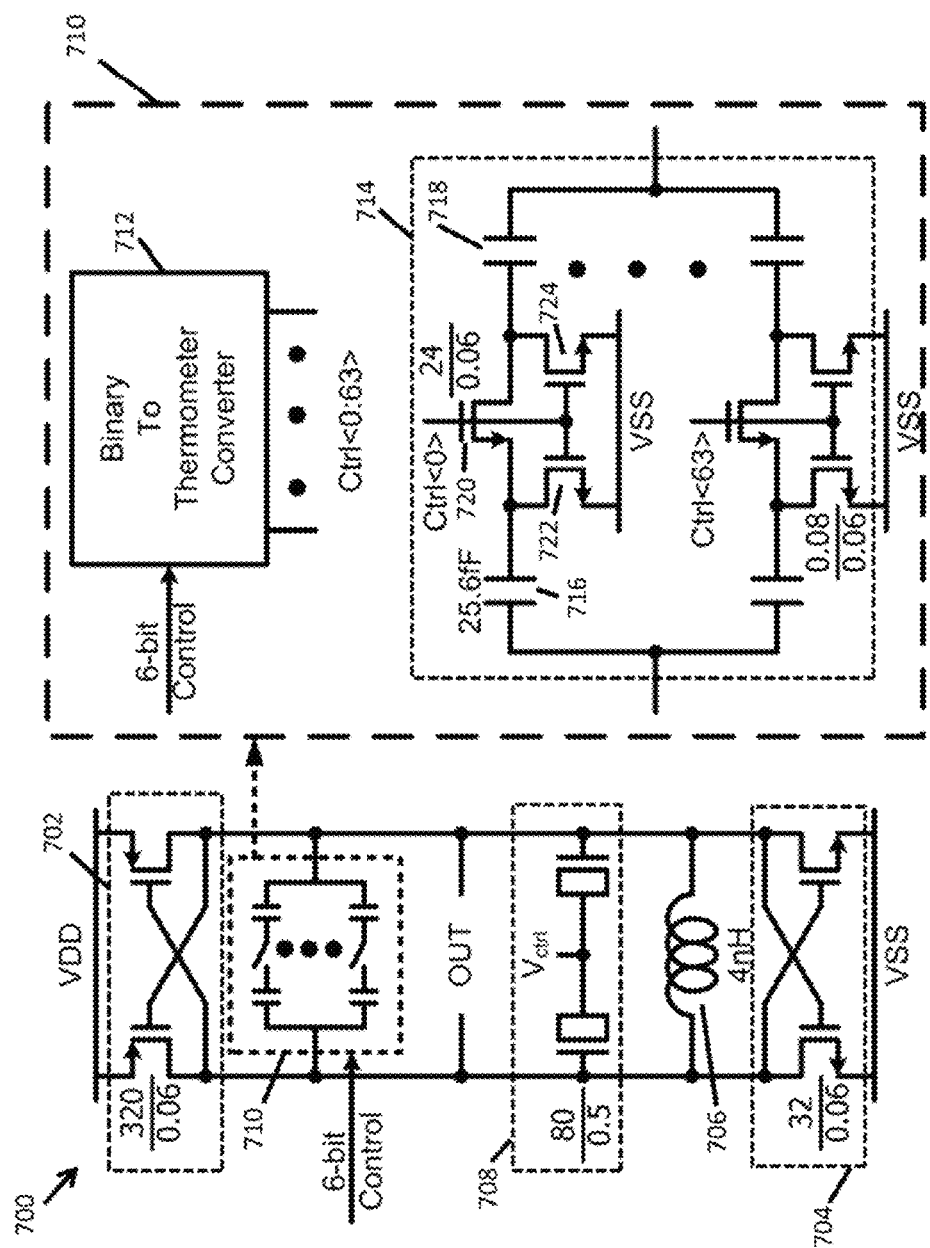
FIG. 7 is a schematic of an example of a voltage controlled oscillator in accordance with some embodiments.

An example 700 of an inverter-based LC-VCO that can be used in PLL circuit 100 in accordance with some embodiments is shown in FIG. 7. As illustrated, VCO 700 can include a first negative transconductance 702, a second negative transconductance 704, an inductor 706, a fine control 708, and a coarse control 710.

First negative transconductance 702 can be any suitable negative transconductance, such as one formed from transistors configured as illustrated. For example, in some embodiments, first negative transconductance 702 can be formed from MOSFETs having a width of 320 μm and a length of 0.06 μm in some embodiments.

Similarly, second negative transconductance 704 can be any suitable negative transconductance, such as one formed from transistors configured as illustrated. For example, in some embodiments, second negative transconductance 704 can be formed from MOSFETs having a width of 32 μm and a length of 0.06 μm in some embodiments.

Figure 11:
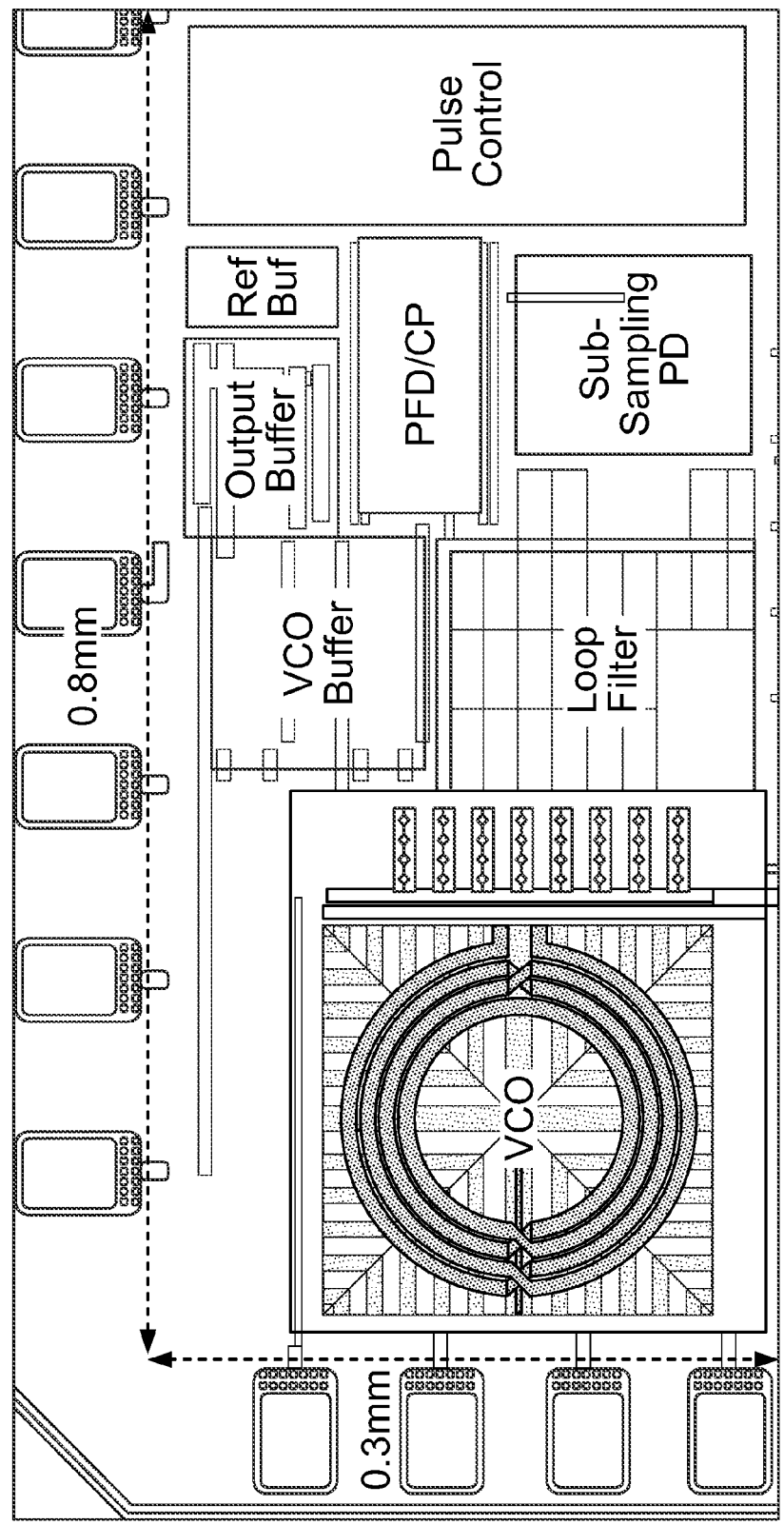
FIG. 11 is a die photo of an example of a circuit layout in accordance with some embodiments.

Inductor 706 can be any suitable inductor. For example, inductor 706 can be a 4nH inductor formed substantially in a plane of an integrated circuit as illustrated in FIG. 11. In some embodiments, the inductor can be selected to have a Q of 6.6 at 2.2 GHz.

Fine control 708 can be any suitable mechanism for providing fine voltage-to-output-frequency control in some embodiments. For example, in some embodiments, fine control 708 can be implemented using transistors configured as varactors as shown in FIG. 7. Any suitable transistors can be used in some embodiments. For example, in some embodiments, fine control 708 can be formed from MOSFETs having a width of 80 μm and a length of 0.5 μm in some embodiments.

Coarse control 710 can be any suitable mechanism for providing coarse voltage-to-output-frequency control in some embodiments. For example, in some embodiments, coarse control 710 can formed from a binary to thermometer controller 712 and a capacitor bank 714 that vary the capacitance of the capacitor bank based on the inputs to the controller. Any suitable controller 712 can be used in some embodiments. For example, a 6-bit controller with six input bits and 64 output bits can be used in some embodiments. Any suitable capacitor bank 714 can be used in some embodiments. For example, a capacitor bank with 64 stages (or any other suitable number), each having a control input tied to a corresponding output of controller 712 can be used in some embodiments. As illustrated, each stage of the capacitor bank can include a pair of capacitors 716 and 718 and three transistors 720, 722, and 724, in some embodiments. Any suitable capacitors and any suitable transistors can be used in some embodiments. For example, capacitors 716 and 718 can be 25.6 fF capacitors in some embodiments. As another example, transistor 720 can be a MOSFET having a width of 24 μm and a length of 0.06 μm in some embodiments. As yet another example, transistors 722 and 724 can be MOSFETs having a width of 0.08 μm and a length of 0.06 μm in some embodiments.

In some embodiment, the VCO can have a frequency tuning gain ($K_{VCO}$) of 150 MHz/V (fine-tuning) and a tuning range from 1.9 GHz to 2.3 GHz (including coarse tuning).

Figure 8:
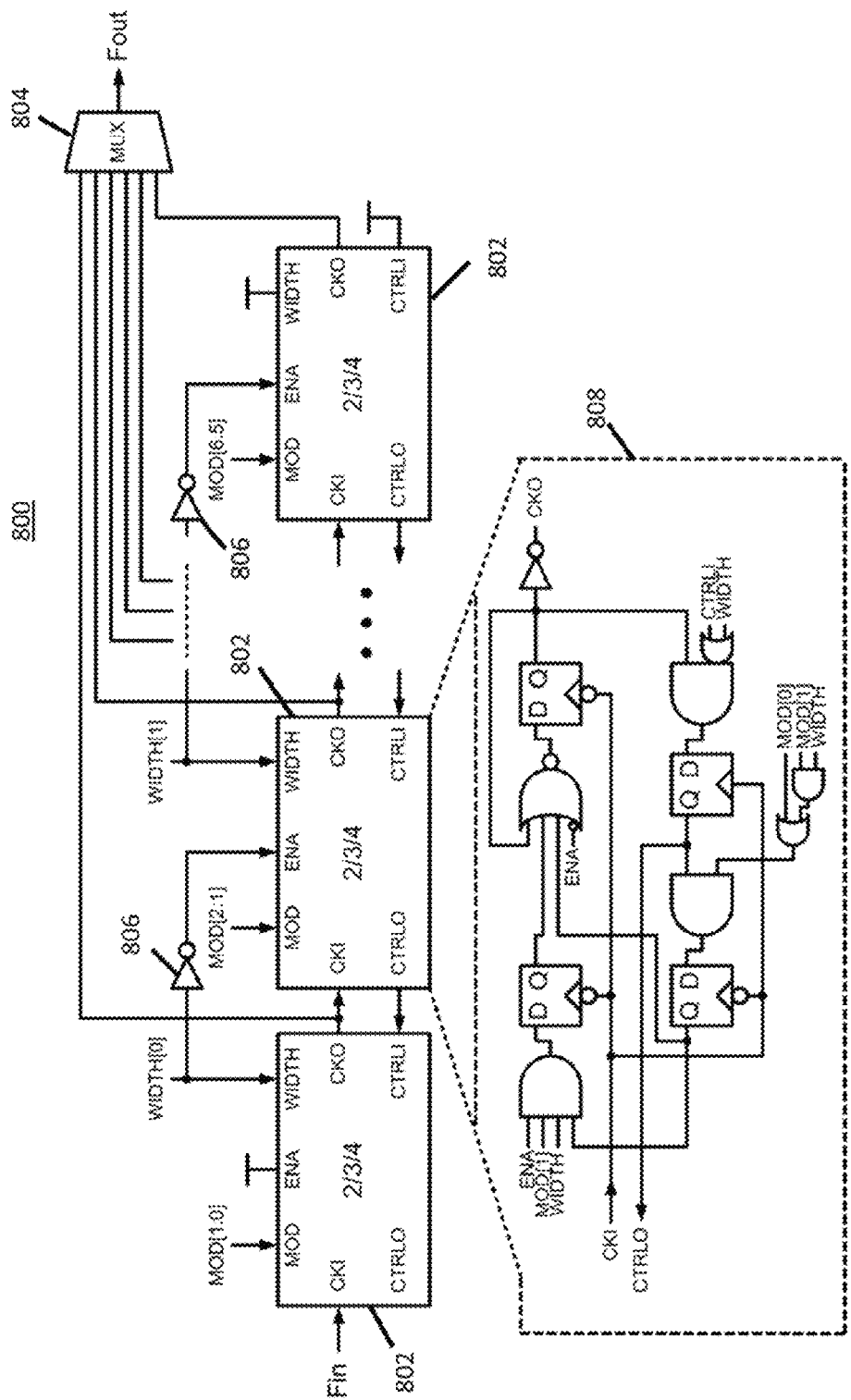
FIG. 8 is a schematic of an example of a divider in accordance with some embodiments.

An example 800 of a programmable divider that can be used in PLL circuit 100 in accordance with some embodiments is shown in FIG. 8. As illustrated, divider 800 can include a plurality of divide-by-2/3/4 modules 802, a multiplexer 804, and a plurality of inverters 806.

Any suitable modules 802 and any suitable number of modules 802 can be used in some embodiments. For example, in some embodiments, each module 802 can be constructed as shown in blow-up 808, and six modules 802 can be used in divider 800. Seven modulus and six width control signals can be provided from any suitable control source for controlling the division performed by divider 800.

Multiplexer 804 can be any suitable multiplexer in some embodiments. For example, as shown in FIG. 8, multiplexer 804 can be a six input multiplexer.

Inverters 806 can be any suitable inverters.

As illustrated, the enable and width inputs of the first module 802 and the last module 802 can be connected to $V_{DD}$) in some embodiments.

Figure 9:
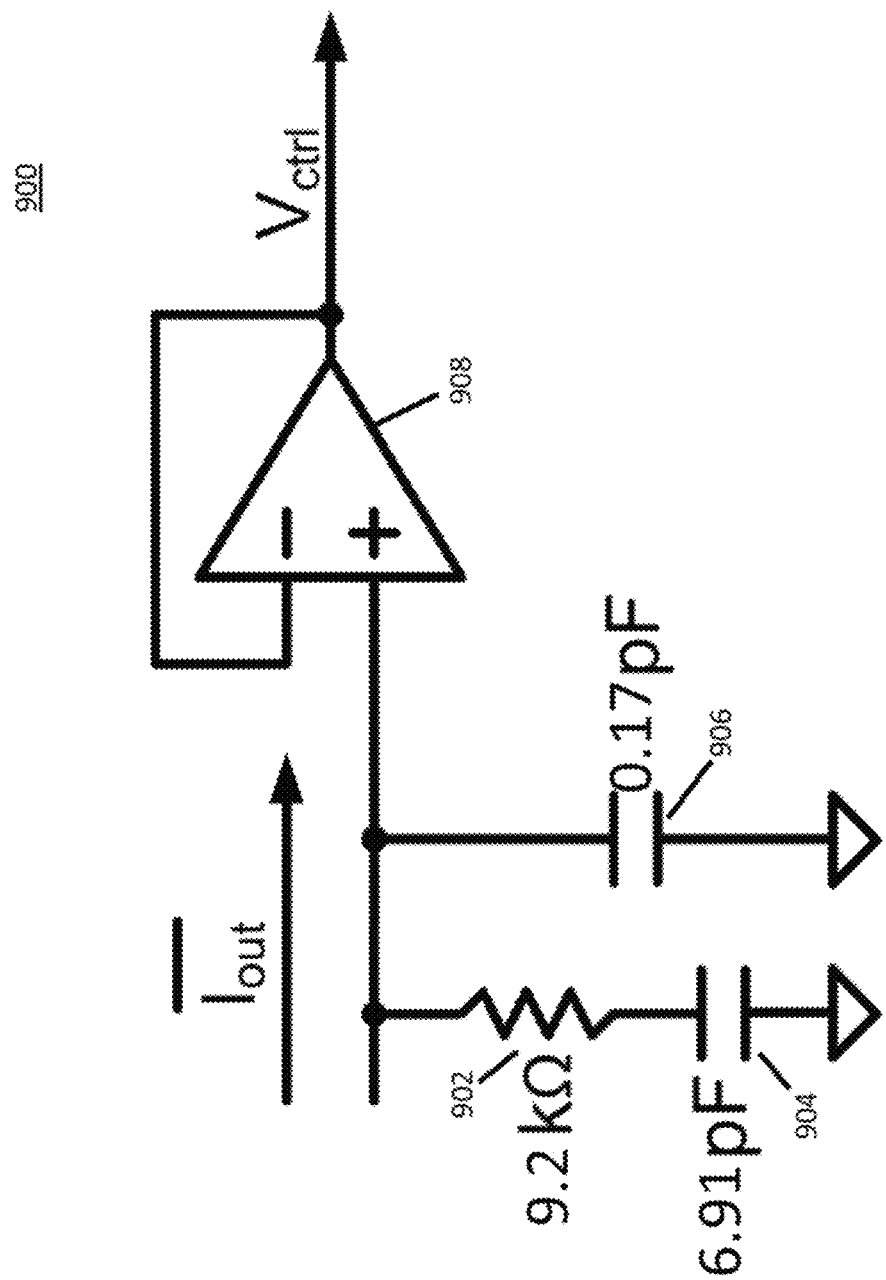
FIG. 9 is a schematic of an example of a loop filter in accordance with some embodiments.

An example 900 of an on-chip loop filter that can be used in PLL circuit 100 in accordance with some embodiments is shown in FIG. 9. As illustrated, filter 900 can include a series resistor 902, a series capacitor 904, a parallel capacitor 906, and a unity-gain buffer 908.

Any suitable resistor 902 and capacitors 904 and 906 can be used, and these components can have any suitable values, in some embodiments. For example, series resistor 902 can have a value of 9.2 kΩ, series capacitor 904 can have a value of 6.91 pF, and parallel capacitor 906 can have a value of 0.17 pF, in some embodiments. In some embodiments, the capacitors can be implemented as Metal-Oxide-Metal (MOM) capacitors.

Unity-gin buffer 908 can be any suitable unity-gain buffer in some embodiments. Unity-gain buffer can provide isolation to the control voltage node of the PLL circuit from the VCO, thereby reducing the kickback from the VCO. In addition, this buffer can act as a first order filter that increases the order of the loop filter.

The transfer function for the noise from the input reference to the output of the PLL can be given by equation (4). By using a combined PD, the contribution of the combined PD's noise to $S_{\phi,n,out}$ is reduced and the contribution from the noise of reference buffers can become significant.

Figure 10:
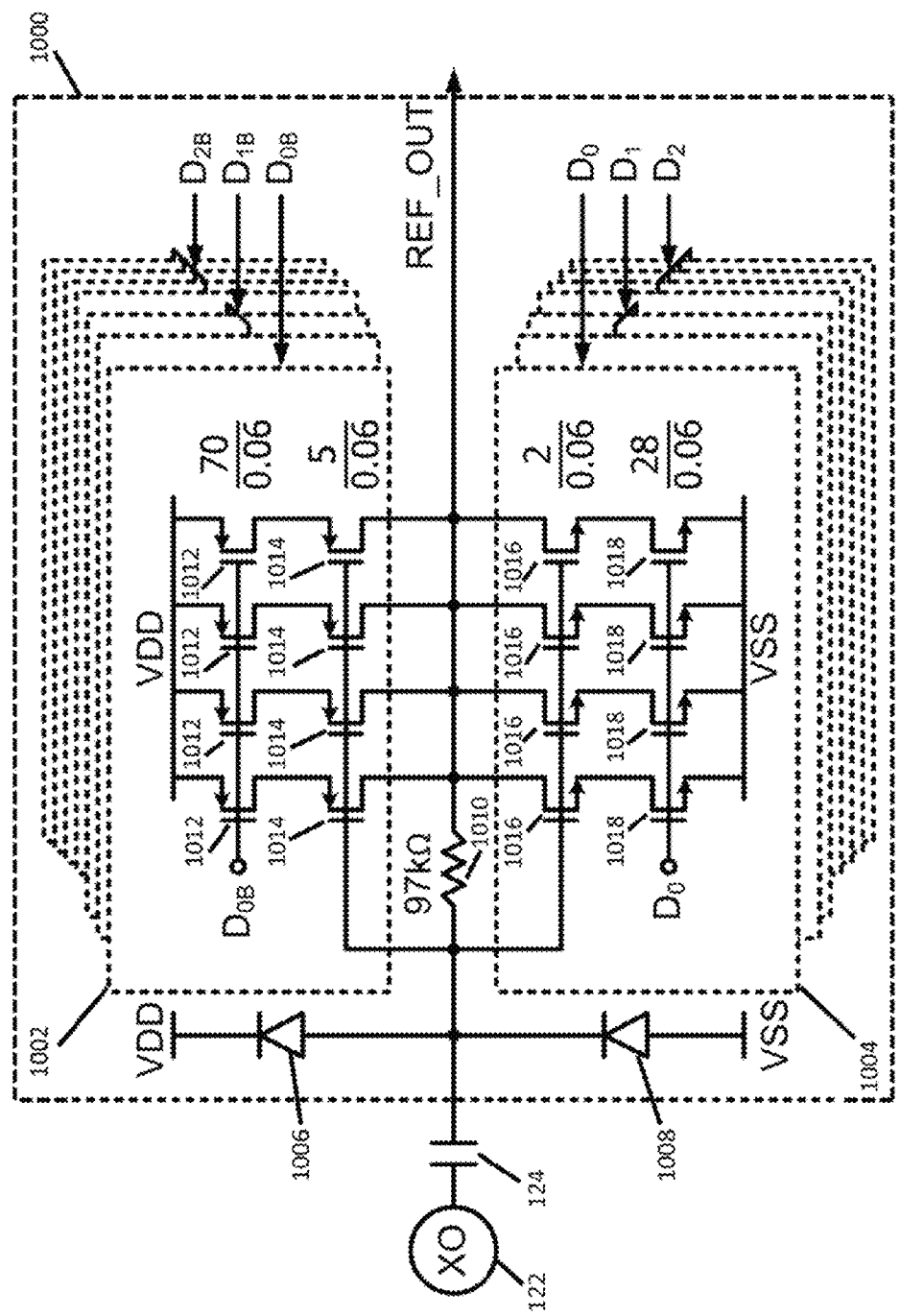
FIG. 10 is a schematic of an example of a reference buffer circuit in accordance with some embodiments.

Turning to FIG. 10, an example 1000 of a reference buffer circuit that can be used in PLL circuit 100 in accordance with some embodiments is illustrated. As shown, circuit 1000 can include a plurality of top stages 1002, a plurality of bottom stages 1004, a top diode 1006, a bottom diode 1008, and a resistor 1010.

Each top stage 1002 can be any suitable circuit for providing part of a reference signal in response to oscillations received from crystal oscillator 122 via capacitor 124. For example, each top stage can include a plurality of transistors 1012 and 1014 arranged as shown. Any suitable number of transistors 1012 and 1014 of any suitable type can be used in each top stage 1002 in some embodiments. For example, in some embodiments, four MOSFET transistors 1012 having a width of 70 μm and a length of 0.06 μm can be used in some embodiments. As another example, in some embodiments, four MOSFET transistors 1014 having a width of 5 μm and a length of 0.06 μm can be used in some embodiments. Each top stage can be controlled by a suitable control signal for turning on the stage as needed by a control signal $D_{XB}$, where X is a number representing the stage or a group of the stages (e.g., as shown, stages may be grouped together in sets of 1, 2, 4, etc. stages).

Each bottom stage 1004 can be any suitable circuit for providing part of a reference signal in response to oscillations received from crystal oscillator 122 via capacitor 124. For example, each bottom stage can include a plurality of transistors 1016 and 1018 arranged as shown. Any suitable number of transistors 1016 and 1018 of any suitable type can be used in each bottom stage 1004 in some embodiments. For example, in some embodiments, four MOSFET transistors 1016 having a width of 2 μm and a length of 0.06 μm can be used in some embodiments. As another example, in some embodiments, four MOSFET transistors 1018 having a width of 28 μm and a length of 0.06 μm can be used in some embodiments. Each bottom stage can be controlled by a suitable control signal for turning on the stage as needed by a control signal $D_X$, where X is a number representing the stage or a group of the stages (e.g., as shown, stages may be grouped together in sets of 1, 2, 4, etc. stages).

Diodes 1006 and 1008 can be any suitable diodes. Similarly, resistor 1010 can be any suitable resistor and can have any suitable value. For example, in some embodiments, resistor 1010 can have a value of 97 kΩ.

In some embodiments, PLL circuits as described herein can be implemented in a 65 nm digital low leakage CMOS process.

In some embodiments, PLL circuits as described herein can operate in one or more modes of operation that use the tri-state PFD/CP only, the sub sampling PD only, or both the tri-state PFD/CP and the sub-sampling PD as a combined PD by providing suitable control signals to the tri-state PFD/CP and/or SSPD.

FIG. 11 shows an example of a die photo of a chip including PLL circuit 100 of FIG. 1. It can occupy an area of 0.24 mm² (without bond-pads) while its loop filter can occupy an area of 0.04 mm², in some embodiments. The circuit can draw 8 mA (excluding the 50 W output buffers) of which 3 mA can be drawn by the LC-VCO.

In some embodiments, the PLL can be integrated with digital circuits on the same die.

In accordance with some embodiments, the combined phase detector described herein can be used to implement an integer-N PLL. Such a PLL can be used for any suitable purpose, such as for clock synthesis and cascaded PLL applications.

Although the invention has been described and illustrated in the foregoing illustrative embodiments, it is understood that the present disclosure has been made only by way of example, and that numerous changes in the details of implementation of the invention can be made without departing from the spirit and scope of the invention, which is only limited by the claims which follow. Features of the disclosed embodiments can be combined and rearranged in various ways.

What is claimed is:

1. A circuit for a combined phase detector, comprising:
   a tri-state phase frequency detector that includes:
      a first flip flop that receives a first input signal, a second input signal, and a reset signal, and that outputs a first output signal;
      a second flip flop that receives a reference input signal having a period $T_{REF}$, a third input signal, the reset signal, and that outputs a second output signal; and
      digital logic hardware that receives the first output signal and the second output signal, and that outputs the reset signal;
   a charge pump that receives the first output signal and the second output signal, and that outputs a fourth output signal; and
   a sub-sampling phase detector that receives the reference signal and a fourth input signal, and that outputs a fifth output signal,
   wherein the fifth output signal and the fourth output signal are coupled together,
   wherein the fourth output signal changes in response to changes in the first output signal and the second output signal when a time difference between corresponding edges of the first input signal and the reference input signal is less than one-half $T_{REF}$, and wherein the tri-state phase frequency detector and charge pump and the sub-sampling phase detector are configured so that, at all times, a maximum current of the fifth output signal is smaller than three times a charge pump current of the tri-state phase frequency detector and charge pump divided by the value of four times the ratio of the frequency of the fourth input signal and the frequency of the reference signal.

2. The circuit of claim 1, further comprising a loop filter coupled to the fourth output signal and to the fifth output signal.

3. The circuit of claim 2, further comprising a voltage controlled oscillator coupled to the loop filter.

4. The circuit of claim 3, wherein the second input signal is based on an output of the voltage controlled oscillator.

5. The circuit of claim 1, further comprising a divider that divides the fourth input signal to provide the second input signal.

6. A circuit for a combined phase detector, comprising:
   a tri-state phase frequency detector that includes:
      a first flip flop that receives a first input signal, a second input signal and a reset signal, and that outputs a first output signal;
      a second flip flop that receives a reference input signal having a period $T_{REF}$, a third input signal, the reset signal, and that outputs a second output signal; and
      digital logic hardware that receives the first output signal and the second output signal, and that outputs the reset signal;
   means for providing a flow of current from a digital signal that receives the first output signal and the second output signal, and that outputs a fourth output signal; and
   means for providing a detection of a phase of a signal by sub-sampling, that receives the reference signal and a fourth input signal, and that outputs a fifth output signal,
   wherein the fifth output signal and the fourth output signal are coupled together,
   wherein the fourth output signal changes in response to changes in the first output signal and the second output signal when a time difference between corresponding edges of the first input signal and the reference input signal is less than one-half $T_{REF}$, and
   wherein a maximum current of the fifth output signal is at all times smaller than three times a current of the fourth output signal divided by the value of four times the ratio of the frequency of the fourth input signal and the frequency of the reference signal.

7. The circuit of claim 6, further comprising a means for low pass filtering coupled to the fourth output signal and to the fifth output signal.

8. The circuit of claim 7, further comprising means for providing an oscillating signal that is voltage controlled coupled to the means for low pass filtering.

9. The circuit of claim 8, wherein the second input signal is based on an output of the means for providing an oscillating signal that is voltage controlled.

10. The circuit of claim 6, further comprising a means for dividing the fourth input signal to provide the second input signal.

* * * * *